(12) United States Patent
Xu

(10) Patent No.: US 8,556,155 B2
(45) Date of Patent: Oct. 15, 2013

(54) SOLDER BALL MOUNTING TOOL

(75) Inventor: Jin-Bao Xu, Taipei (TW)

(73) Assignee: Compal Information (Kunshan) Co., Ltd., Jiangsu (CN)

( * ) Notice: Subject to any disclaimer, the term of this patent is extended or adjusted under 35 U.S.C. 154(b) by 64 days.

(21) Appl. No.: 13/422,883

(22) Filed: Mar. 16, 2012

(65) Prior Publication Data

US 2013/0140344 A1 Jun. 6, 2013

(30) Foreign Application Priority Data

Dec. 1, 2011 (CN) .......................... 2011 1 0405374

(51) Int. Cl.
*B23K 37/04* (2006.01)
*B23K 5/00* (2006.01)
*B05C 13/00* (2006.01)

(52) U.S. Cl.
USPC .............................. 228/49.5; 228/41; 118/500

(58) Field of Classification Search
USPC .............. 228/39, 41, 49.5, 248.1, 248.5, 214, 228/215; 118/500–505
See application file for complete search history.

(56) References Cited

U.S. PATENT DOCUMENTS

| | | | | |
|---|---|---|---|---|
| 4,829,664 A | * | 5/1989 | Kabeshita et al. | 29/840 |
| 5,392,980 A | * | 2/1995 | Swamy et al. | 228/119 |
| 5,623,872 A | * | 4/1997 | Tomomatsu | 101/126 |
| 5,921,462 A | * | 7/1999 | Gordon | 228/191 |
| 6,182,883 B1 | * | 2/2001 | Nikmanesh | 228/33 |
| 6,412,685 B2 | * | 7/2002 | Hertz et al. | 228/246 |
| 7,107,672 B2 | * | 9/2006 | Onitsuka et al. | 29/832 |
| 7,617,587 B2 | * | 11/2009 | Jo et al. | 29/564.2 |
| 7,845,539 B1 | * | 12/2010 | Kim et al. | 228/39 |
| 7,921,552 B2 | * | 4/2011 | Vigil et al. | 29/832 |

* cited by examiner

*Primary Examiner* — Kiley Stoner
*Assistant Examiner* — Carlos Gamino
(74) *Attorney, Agent, or Firm* — Muncy, Geissler, Olds & Lowe, PLLC

(57) ABSTRACT

A solder paste mounting tool is provided, and includes a base, a positioning plate, a screen plate, and a pushing element. The base includes a first surface, a second surface, a through hole extending through the first surface and the second surface, a first chip accommodating portion, and positioning pillars. The first chip accommodating portion and the positioning pillars are located on the first surface, and the position of the first chip accommodating portion is corresponding to the position of the through hole. The positioning plate includes a second chip accommodating portion and first positioning holes corresponding to the positioning pillars. The screen plate includes a mesh region and second positioning holes corresponding to the positioning pillars. The pushing element is movably disposed in the through hole and includes a first end portion and a second end portion.

10 Claims, 13 Drawing Sheets

SOLDER BALL MOUNTING TOOL

RELATED APPLICATIONS

This application claims priority to Chinese Application Serial Number 201110405374.8, filed Dec. 1, 2011, which is herein incorporated by reference.

BACKGROUND

1. Technical Field

The present disclosure relates to a solder paste mounting tool, more particular to a solder paste mounting tool applied to a ball grid array (BGA) process.

2. Description of Related Art

In recent years, functions and efficiency of technically advanced consumer electronic products have been improved, so that chips used in the electronic products need to have some advantages such as fast computing speed and small volume.

A quad flat package (QFP) is one of the chip package techniques in early days, metal conductive wires surrounded a chip are used as connecting pins. However, the area of the chip may limit the number of the connecting pins of the chip, and such a chip has poor electrical characteristics and thermal conductivity. For the past few years, another so-called ball grid array (BGA) chip is increasing demanded. The BGA chip includes connecting pads in an array arrangement, and solder paste formed on the connecting pads replace the connecting pins utilizing the metal conductive wires. Compared with the quad flat package, one advantage of the ball grid array chip is that when the BGA chip and the QFP chip have the same area, the number of the connecting pads of the BGA chip is greater than the number of the connecting pins of the QFP chip, such that the area and weight of the BGA chip can be half as much as those of the QFP chip.

A conventional solder paste mounting tool applied to a BGA process includes a steel plate having a hollow region, a screen plate, and a cover. First, a chip is placed on the steel plate, and connecting pads of the chip are aligned with the hollow region of the steel plate. Then, the cover is assembled with the screen plate, such that the chip is sandwiched between the cover and the screen plate and the connecting pads face the screen plate. Then, the screen plate is applied with solder paste. After the solder paste penetrates the screen plate and adheres to the connecting pads, the cover may be detached.

However, when detaching the chip, a user needs to tap the screen plate with his fingers, such that the connecting pads of the chip can be separated from the screen plate. As a result, not only the fingers need to be cleaned because of touching the solder paste, but also the connecting pads having the solder paste are difficult to be separated from the screen plate in a perpendicular direction, such that the thickness of the solder paste is difficult to be uniform. Moreover, different users may have different operation errors, such that the quality of the balls formed from the solder paste are difficult to be controlled. In addition, each of the chips adhered with the solder paste needs to be placed on a mold plate to perform subsequent processes (such as laser alignment), thus wasting time.

SUMMARY

An aspect of the present invention is to provide a solder paste mounting tool.

In an embodiment of the present invention, a solder paste mounting tool includes a base, a positioning plate, a screen plate, and a pushing element. The base includes a first surface, a second surface, a through hole, a first chip accommodating portion, and a plurality of positioning pillars. The second surface and the first surface are located in the opposite surface of the base. The through hole passes through the first surface and the second surface. The first chip accommodating portion and the positioning pillars are located on the first surface. The position of the first chip accommodating portion is corresponding to the through hole. The positioning plate includes a second chip accommodating portion and a plurality of first positioning holes corresponding to the positioning pillars. When the first positioning holes are coupled with the positioning pillars, the second chip accommodating portion is aligned with the first chip accommodating portion. The screen plate includes a mesh region and a plurality of second positioning holes corresponding to the positioning pillars. When the second positioning holes are coupled with the positioning pillars and a chip is placed in the first chip accommodating portion, the mesh region is aligned with the first chip accommodating portion. The pushing element is movably disposed in the through hole. The pushing element includes a first end portion adjacent to the first surface and a second end portion adjacent to the second surface. When being used, the chip is placed in the second chip accommodating portion, and then is placed in the first chip accommodating portion by overturning the positioning plate and the base 180 degrees. Connecting pads of the chip are applied with solder paste through the mesh region. Moreover, when the second end portion of the pushing element is pressed, the chip is pushed by the first end portion of the pushing element and disengages from the first chip accommodating portion.

In an embodiment of the present invention, the mounting ball tool further includes a cushion pad which is located in an opening of the through hole adjacent to the first surface or is located on the first end portion.

In an embodiment of the present invention, the material forming the cushion pad includes rubber or plastic.

In an embodiment of the present invention, holes of the mesh region are corresponding to the connecting pads of the chip.

In an embodiment of the present invention, a depth of the second chip accommodating portion is greater than a thickness of the chip.

In an embodiment of the present invention, the positioning plate further comprises a supporting portion formed in the second chip accommodating portion for supporting edges of the chip.

In an embodiment of the present invention, a width of the supporting portion is greater than or equal to about 1 mm.

In an embodiment of the present invention, the base further comprises a plurality of flexible elements located on the first surface for separating the positioning plate or the screen plate from the first surface in a perpendicular direction.

In an embodiment of the present invention, each of the flexible elements includes a spring.

In an embodiment of the present invention, the material forming the base or the screen plate includes steel.

In the aforementioned embodiments of the present invention, the positioning plate and the screen plate are optionally assembled with the base. The operation of the mounting ball tool includes the following steps. The chip is placed in the second chip accommodating portion of the positioning plate, and the connecting pads of the chip face the bottom surface of the second chip accommodating portion. Then, the first positioning holes of the positioning plate are coupled with the positioning pillars of the base, and the base and the positioning plate are overturned by 180 degrees, such that the chip is placed in the first chip accommodating portion. Thereafter, the positioning plate is removed, and the second positioning holes of the screen plate are coupled with the positioning pillars of the base. Then, the solder paste is applied on the mesh region of the screen plate. Thereafter, the screen plate is removed, and the connecting pads of the chip are covered with the solder paste. Then, the first positioning holes of the positioning plate are coupled with the positioning pillars of the base, and the base and the positioning plate are overturned by 180 degrees. The second end portion of the pushing element is pressed, the chip is pushed by the first end portion of the pushing element and disengages from the first chip accommodating portion of the base, such that the chip is located in the second chip accommodating portion of the positioning plate.

The screen plate includes the flexible elements and the second position holes corresponding to the positioning pillars. Therefore, a user do not need to touch the solder paste with his fingers, and the connecting pads with the solder paste can be separated from the screen plate in the perpendicular direction, such that the solder paste covering the connecting pads can be uniform in thickness. In addition, operation errors will not happen to different users easily, such that the quality of the solder paste covering the connecting pads can be easily controlled. Furthermore, each chip on which the coating of the solder paste is completed can be separated from the first chip accommodating portion of the base by using the pushing element and is disposed in the second chip accommodating portion of the positioning plate. As a result, the chip located in the second chip accommodating portion of the positioning plate can be performed with subsequent processes (such as laser alignment) and thus it is time-saving.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
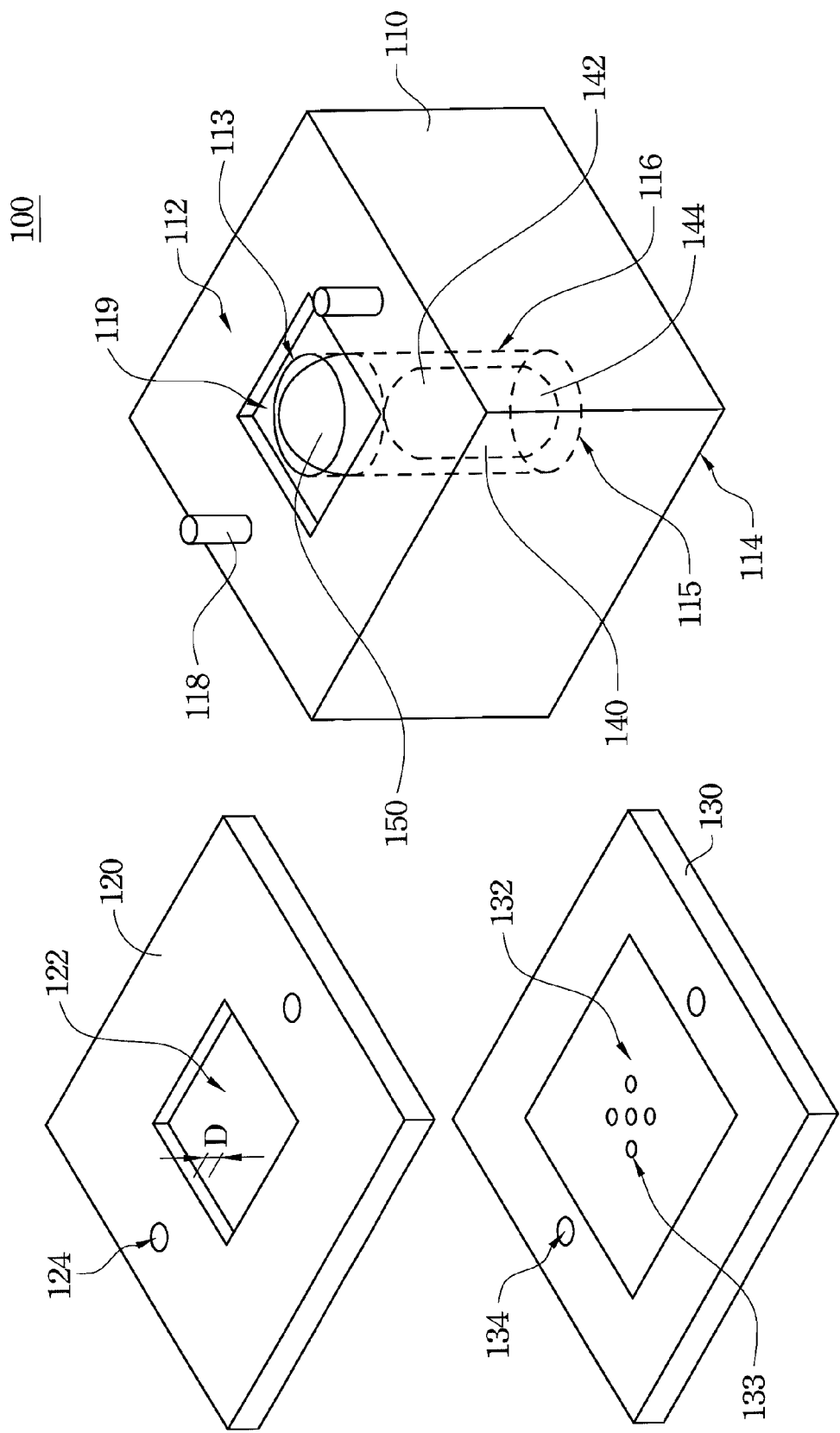
FIG. 1 is a 3-D view of a solder paste mounting tool according to an embodiment of the present invention.

FIG. 1 is a 3-D view of a solder paste mounting tool 100 according to an embodiment of the present invention. As shown in FIG. 1, the solder paste mounting tool 100 includes a base 110, a positioning plate 120, a screen plate 130, and a pushing element 140. The base 110 includes a first surface 112, a second surface 114, a through hole 116, a first chip accommodating portion 119, and a plurality of positioning pillars 118. The second surface 114 and the first surface 112 are located in the opposite surface of the base 110. The through hole 116 passes through the first surface 112 and the second surface 114, such that an opening 113 is formed on the first surface 112, and another opening 115 is formed on the second surface 114. The first chip accommodating portion 119 and the positioning pillars 118 are located on the first surface 112, and the position of the first chip accommodating portion 119 is corresponding to the position of the through hole 116. The positioning plate 120 includes a second chip accommodating portion 122 and a plurality of first positioning holes 124 corresponding to the positioning pillars 118. When the first positioning holes 124 are coupled with the positioning pillars 118, the second chip accommodating portion 122 is aligned with the first chip accommodating portion 119. The screen plate 130 includes a mesh region 132 and a plurality of second positioning holes 134 corresponding to the positioning pillars 118. When the second positioning holes 134 are coupled with the positioning pillars 118, the mesh region 132 is aligned with the first chip accommodating portion 119. The pushing element 140 is movably located in the through hole 116. The pushing element 140 includes a first end portion 142 adjacent to the first surface 112 and a second end portion 114 adjacent to the second surface 144.

In this embodiment, the solder paste mounting tool 100 may optionally include a cushion pad 150 located in the opening 113 of the through hole 116 adjacent to the first surface 112. The material of the cushion pad 150 may include rubber or plastic. The mesh region 132 includes holes 133 to allow a solder paste to pass through. The material of the base 110 or the screen plate 130 may include steel. The material of the positioning plate 120 may include plastic.

When being used, the second chip accommodating portion 122 is used for placing a chip therein, and the chip may also be placed in the first chip accommodating portion 119. The mesh region 132 is used for applying the solder paste, such that the solder paste can be adhered to the connecting pads of the chip. Moreover, when the second end portion 144 of the pushing element 140 is pressed, the chip is pushed by the first end portion 142 of the pushing element 140 and disengages from the first chip accommodating portion 119 of the base 110. It should be understood that, in the following descriptions, the connection relationships among the aforementioned components will not be described again, and aspects related to the using methods and the operation steps of applying the aforementioned components of the solder paste mounting tool 100 to a ball-mounting process will be described in detail.

Figure 2:
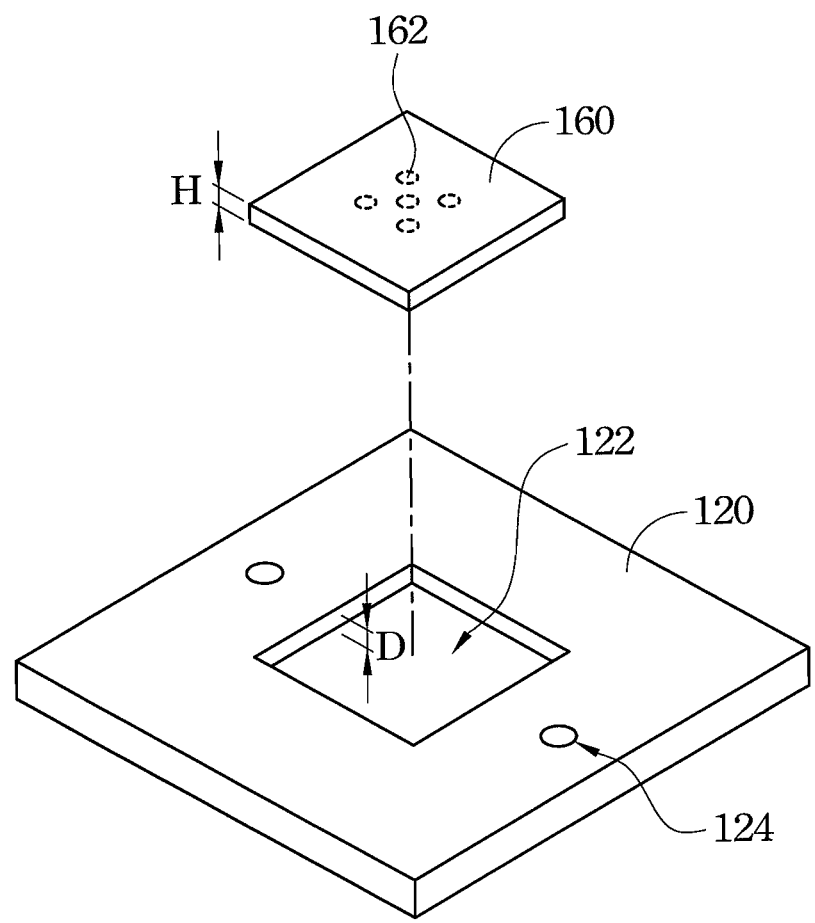
FIG. 2 to FIG. 11 are 3-D views of operating the solder paste mounting tool shown in FIG. 1.

FIG. 2 to FIG. 11 are 3-D views of operating the solder paste mounting tool 100 shown in FIG. 1. As shown in FIG. 2, the depth D of the second chip accommodating portion 122 is greater than the thickness H of the chip 160, and a side which includes the connecting pads 162 of the chip 160 faces the second chip accommodating portion 122. A user may place the chip 160 in the second chip accommodating portion 122 by using a suction pen (not shown).

Figure 3:
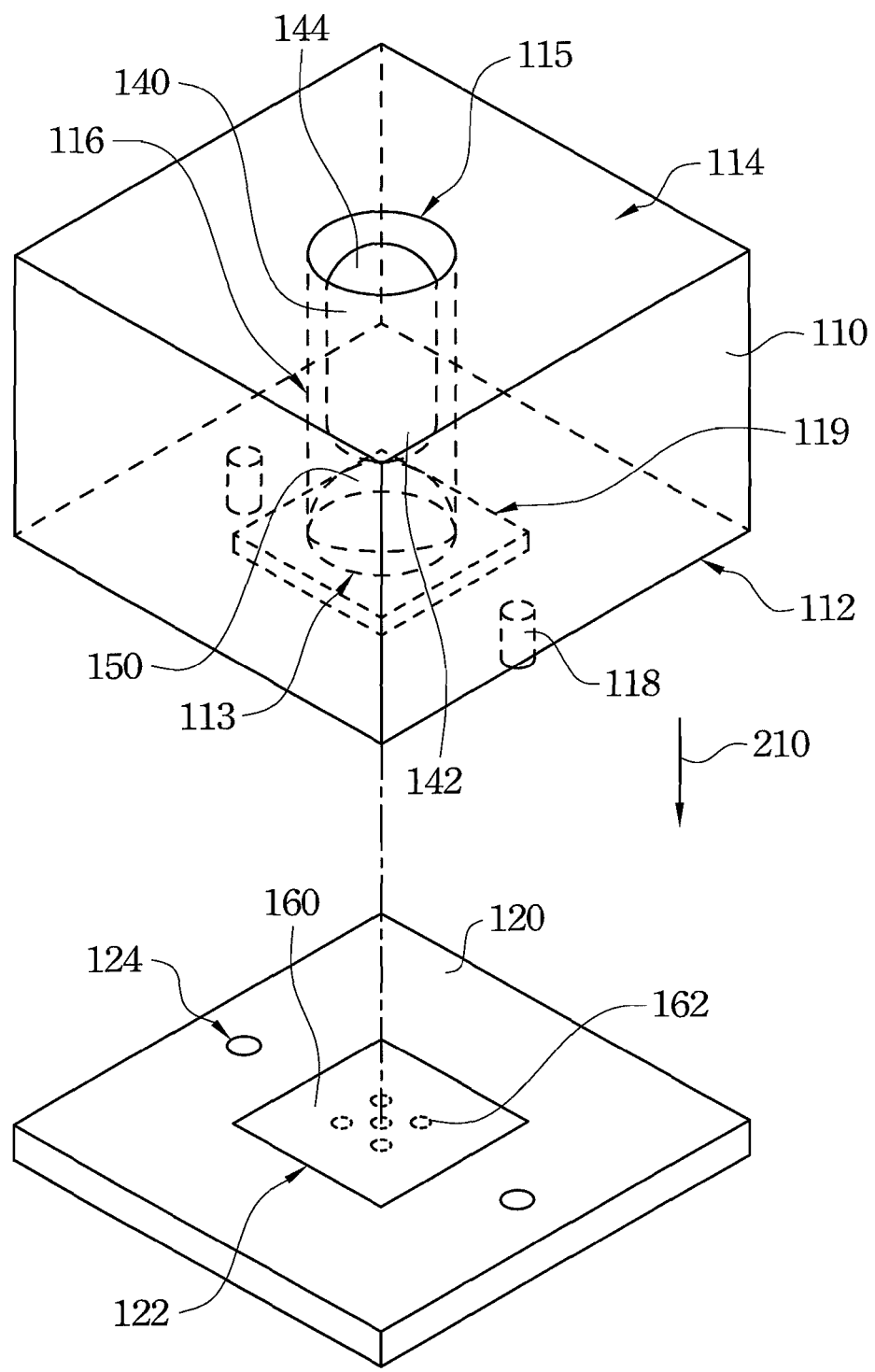

As shown in FIG. 3, when the chip 160 is coupled to the second chip accommodating portion 122, the base 110 may be assembled with the positioning plate 120 in a direction 210 because the first positioning holes 124 of the positioning plate 120 may be coupled with the positioning pillars 118 of the base 110. Then, the base 110 and the positioning plate 120 are overturned by 180 degrees, so that the structure shown in FIG. 4 can be obtained. In order to reduce operation errors, the size of each of the first positioning holes 124 may be designed for just allowing each of the positioning pillars 118 to enter or leave, such that the base 110 can only be assembled with the positioning plate 120 in the perpendicular direction 210. With such a design, the corresponding positions between the chip 160 and the first chip accommodating portion 119 can have significant accuracy.

Figure 4:
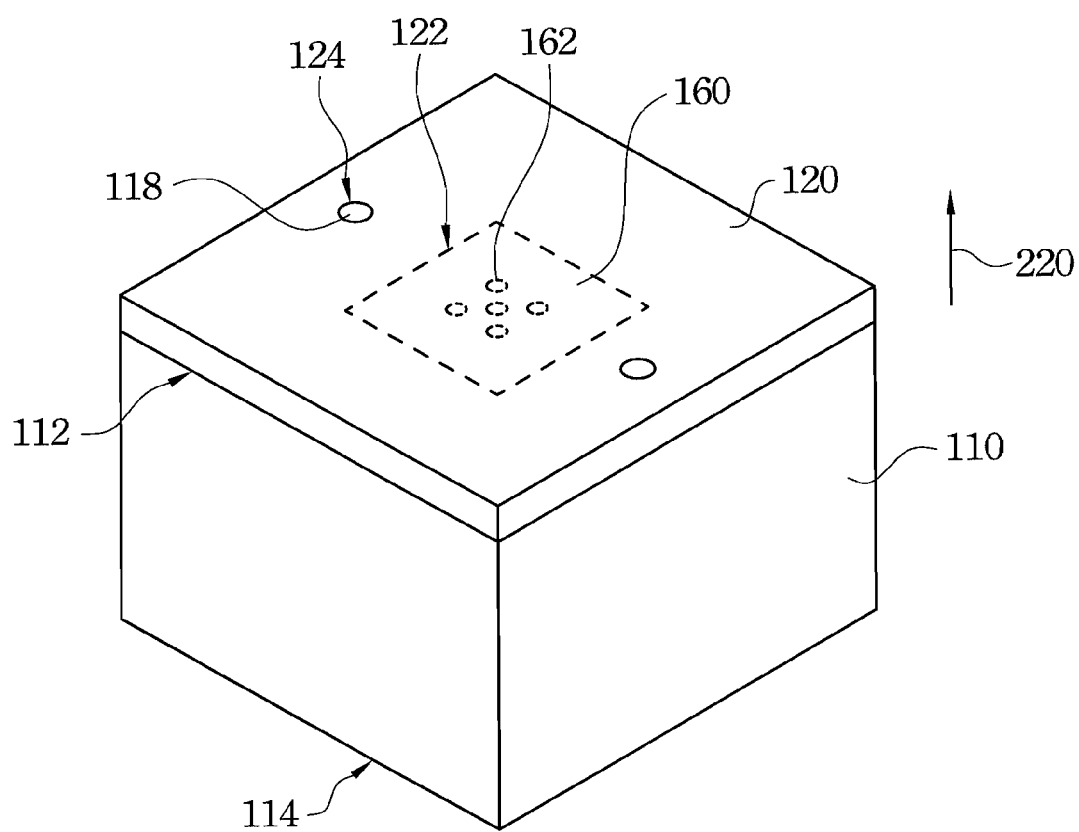
Figure 5:
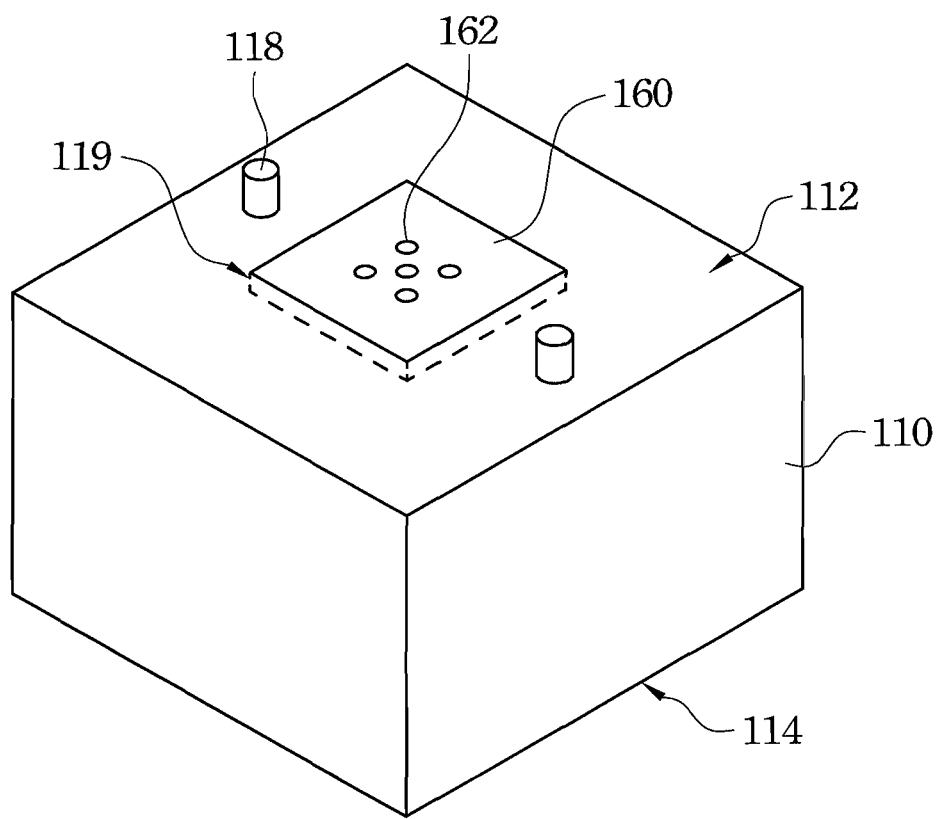
Figure 6:
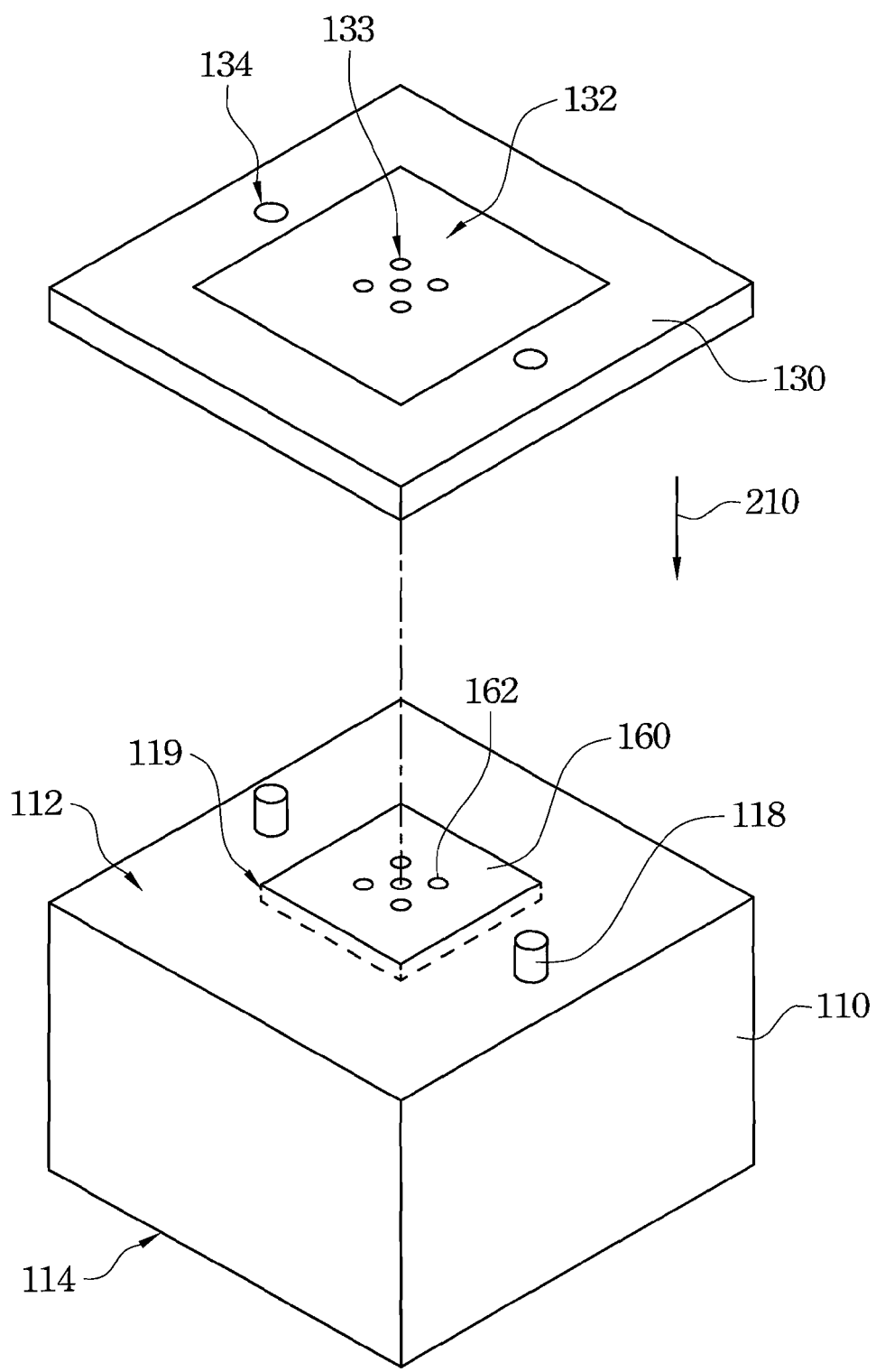

As shown in FIG. 4 and FIG. 5, after the positioning plate 120 is removed from the first surface 112 of the base 110 in a direction 220, the chip 160 disengages from the second chip accommodating portion 122 of the positioning plate 120 due to gravity, such that the chip 160 is placed in the first chip accommodating portion 119 of the base 110. At this time, the cushion pad 150 (see FIG. 1) is located under the chip 160. As shown in FIG. 6, the screen plate 130 is assembled to the base 110 in the direction 210, and then the second positioning holes 134 of the screen plate 130 are coupled with the positioning pillars 118 of the base 110. Moreover, the positions of holes 133 of the mesh region 132 correspond to the positions of the connecting pads 162.

After the screen plate 130 is assembled to the base 110, the user may apply the solder paste on the mesh region 132 of the screen plate 130, such that the solder paste may pass through the holes 133 of the mesh region 132 and adhere to the connecting pads 162.

Figure 7:
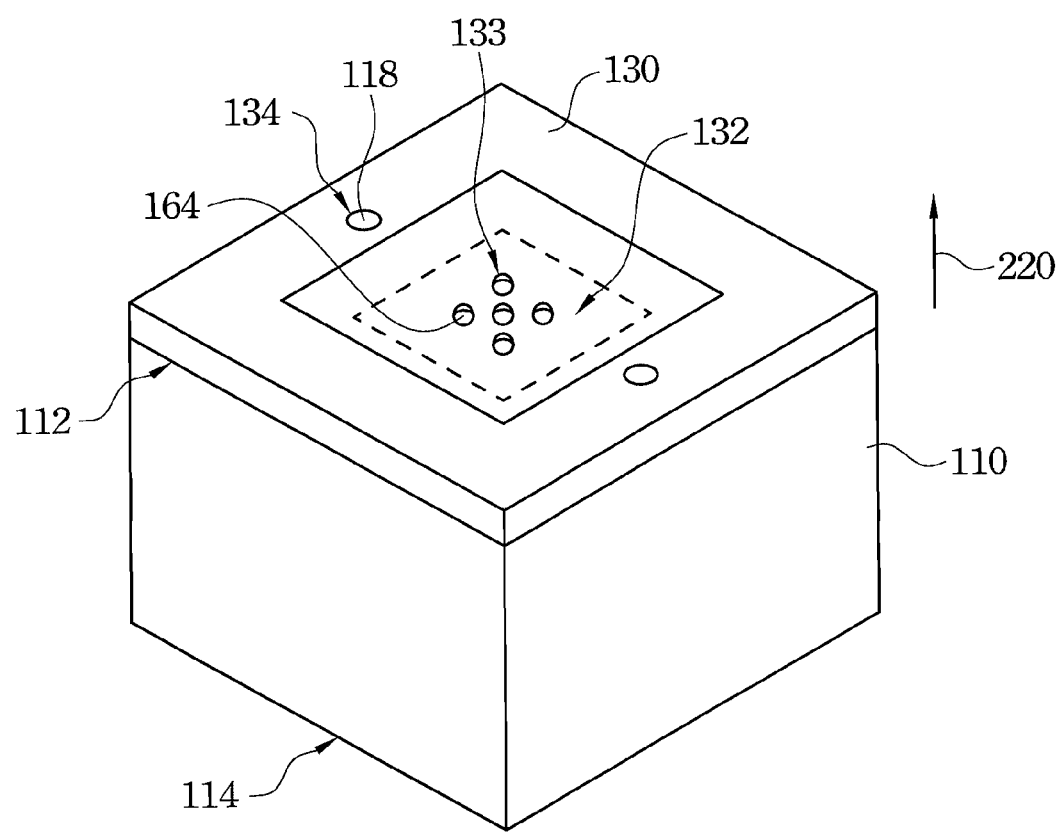
Figure 8:
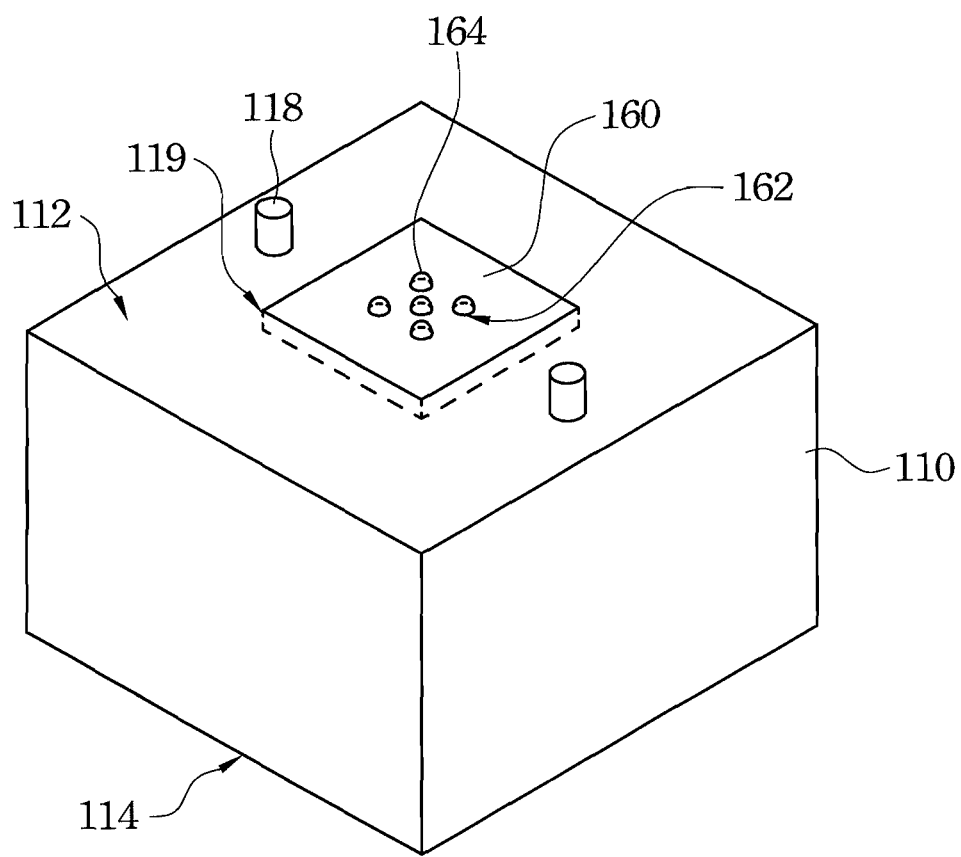
Figure 9:
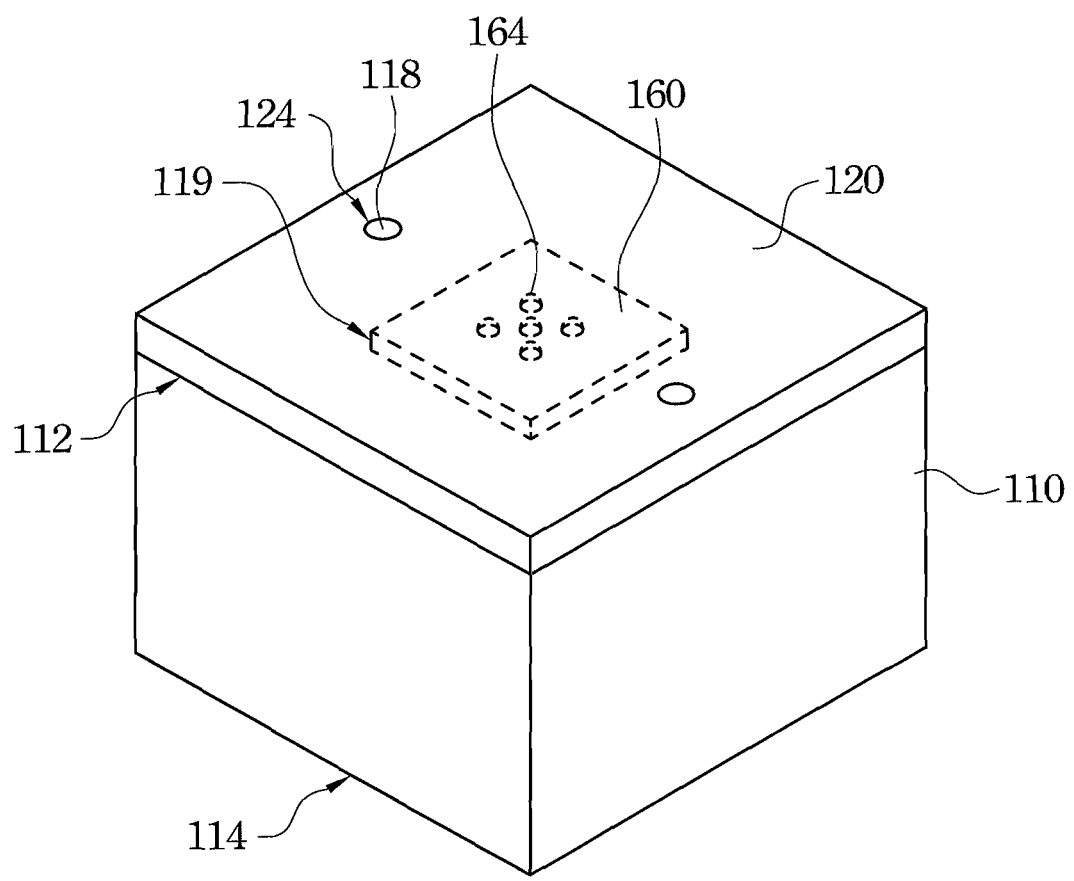

As shown in FIG. 7 and FIG. 8, after the solder paste is applied on the mesh region 132, the screen plate 130 is removed in the direction 220. At this time, the user needs to check if the connecting pads 162 have been covered with the solder paste 164. In order to reduce operation errors, the size of each of the second positioning holes 134 may be designed for just allowing each of the positioning pillars 118 to enter or leave, such that the screen plate 130 can only be separated from the base 110 in the perpendicular direction 220. Therefore, the thickness of the solder paste 164 covering the connecting pads 162 is relatively uniform. As shown in FIG. 9, the positioning plate 120 is assembled with the base 110 again. That is, the first positioning holes 124 of the positioning plate 120 are coupled with the positioning pillars 118 of the base 110, and the chip 160 remains in the first chip accommodating portion 119 of the base 110. Then, the base 110 and the positioning plate 120 are overturned by 180 degrees, so that the structure shown in FIG. 10 can be obtained.

Figure 10:
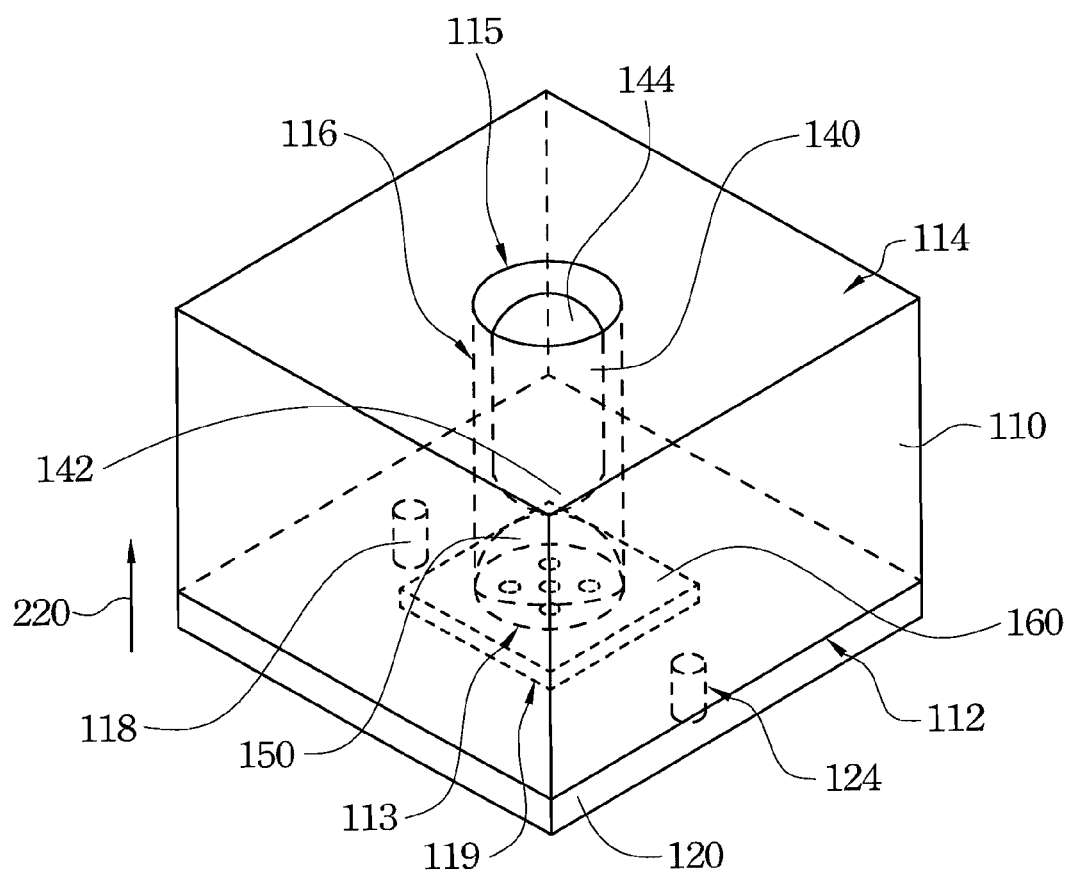

As shown in FIG. 10, since it is difficult to separate the chip 160 from the first chip accommodating portion 119 merely by gravity, the user may press the second end portion 144 of the pushing element 140, such that the chip 160 can be pushed by the first end portion 142 through the cushion pad 150 so as to be separated from the first chip accommodating portion 119 and to be in the second chip accommodating portion 122 (see FIG. 2) of the positioning plate 120. Then, the base 110 is removed from the positioning plate 120 in the direction 220, so that the structure shown in FIG. 11 can be obtained. In subsequent processes, the chip 160 located in the second chip accommodating portion 122 (shown in FIG. 2) of the positioning plate 120 may be directly performed with proceeded laser alignment.

Figure 11:
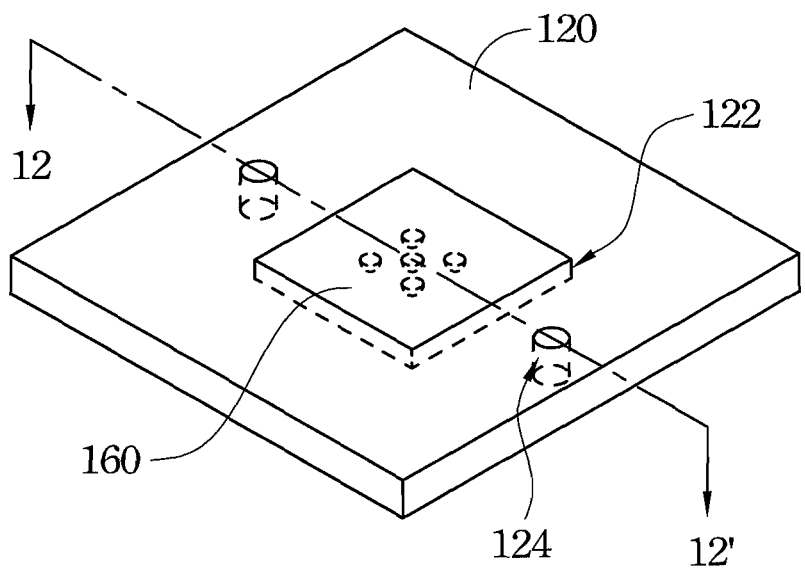
Figure 12:
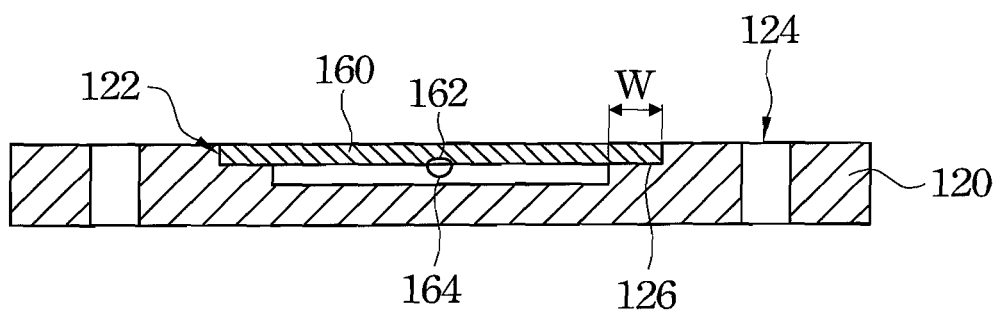
FIG. 12 is a cross-sectional view of a positioning plate taken along line 12-12' shown in FIG. 11.

FIG. 12 is a cross-sectional view of a positioning plate 120 taken along line 12-12' shown in FIG. 11. In this embodiment, the positioning plate 120 may optionally include a supporting portion 126 formed in the second chip accommodating portion 122 for supporting edges of the chip 160. A width W of the supporting portion 126 is greater than or equal to about 1 mm. With such a design, the solder paste 164 adhered to the connecting pads 162 will not contact the positioning plate 120 easily, such that the thickness of the solder paste 164 is relatively uniform.

Figure 13:
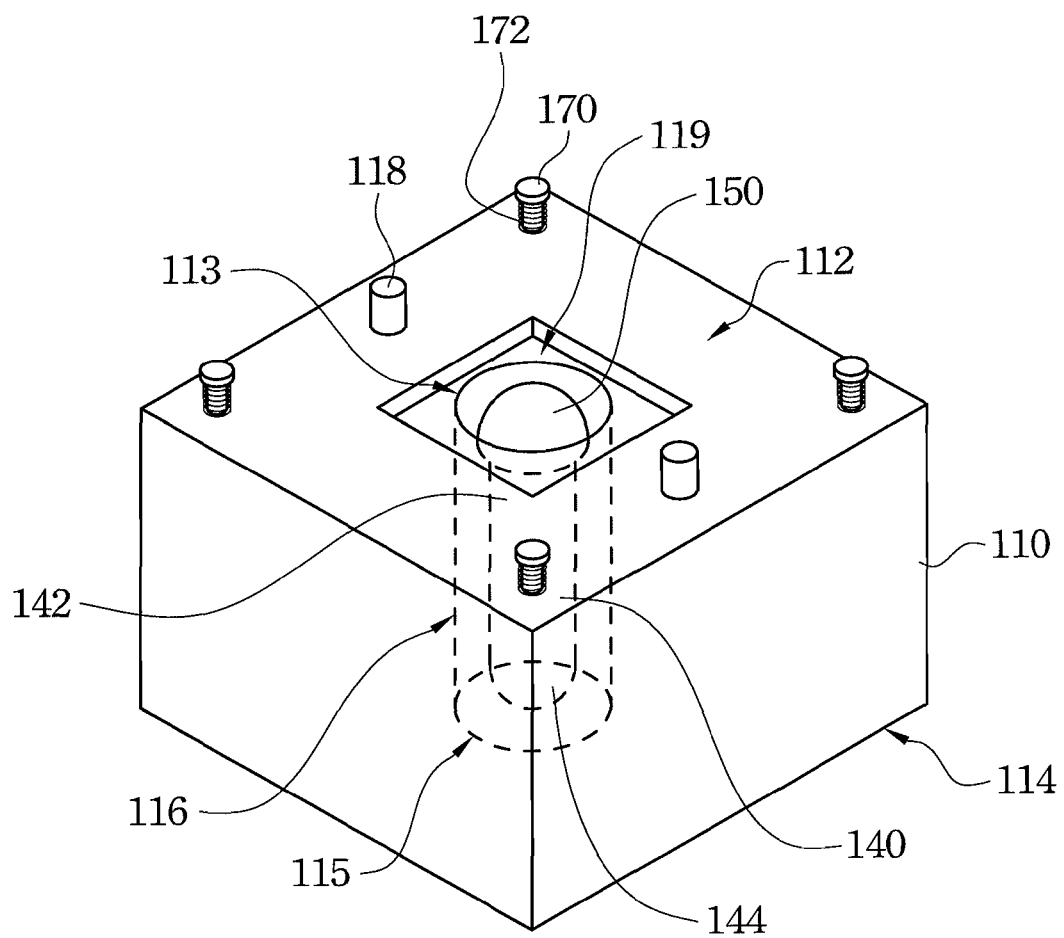
FIG. 13 is a 3-D view of a base of FIG. 1 according to another embodiment of the present invention.

FIG. 13 is a 3-D view of the base 100 of FIG. 1 according to another embodiment. As shown in FIG. 1 and FIG. 13, in this embodiment, the cushion pad 150 is located on the first end portion 142 of the pushing element 140 and is movable in the through hole 116 along with the pushing element 140. Furthermore, the base 110 further includes a plurality of flexible elements 170 located on the corners of the first surface 112 for assuring that the positioning plate 120 or the screen plate 130 can be separated from the first surface 112 in a perpendicular direction, such that the thickness of the solder paste is relatively uniform. In this embodiment, each of the flexible elements 170 may include a spring 172. However, in another embodiment, the flexible elements 170 also can be a flexible material similar to a robber pad.

Figure 14:
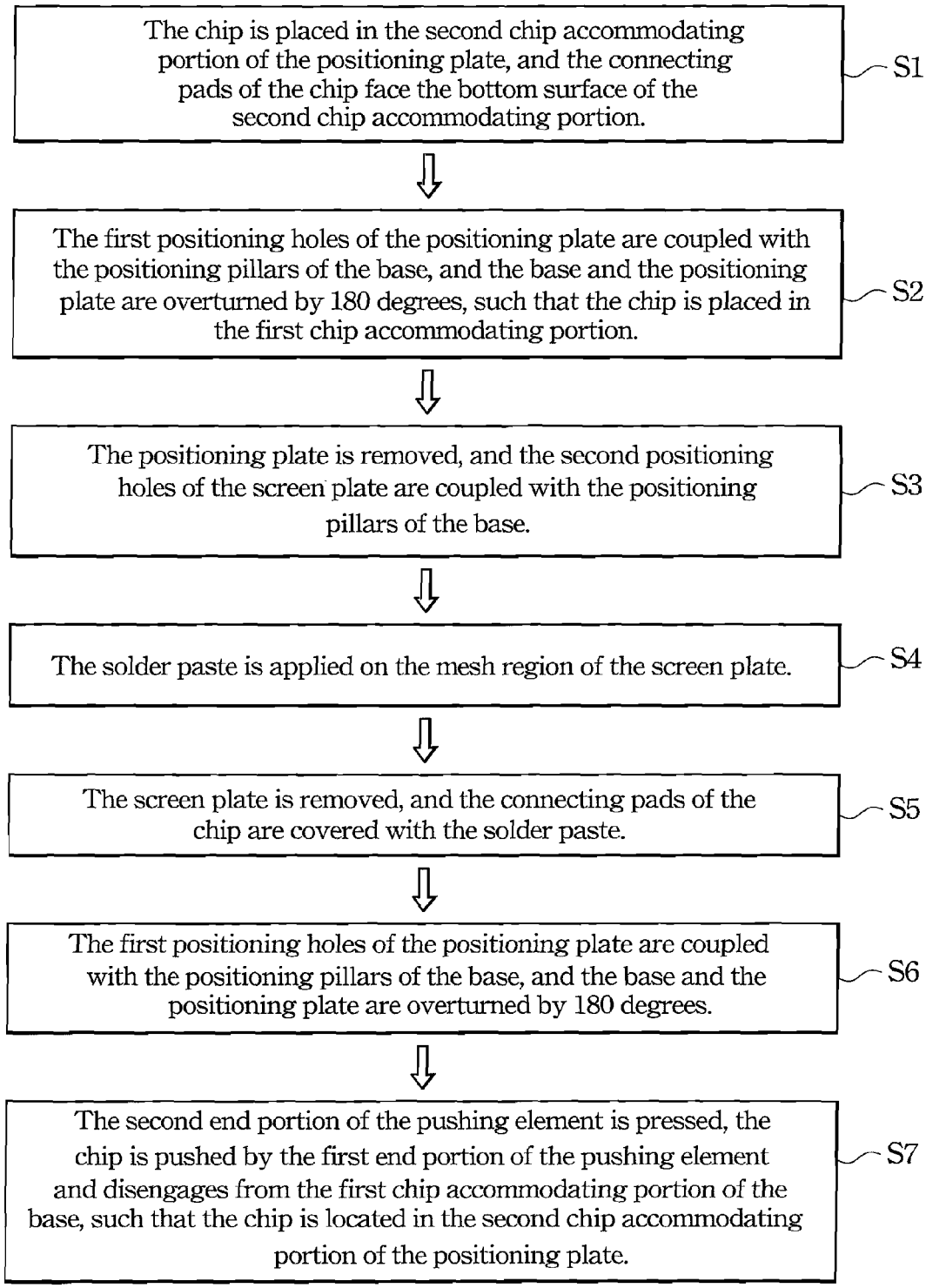
FIG. 14 is a flow chart of operating the solder paste mounting tool shown in FIG. 1.

FIG. 14 is a flow chart of operating the solder paste mounting tool 100 shown in FIG. 1. In step S1, the chip is placed in the second chip accommodating portion of the positioning plate, and the connecting pads of the chip face the bottom surface of the second chip accommodating portion. In step S2, the first positioning holes of the positioning plate are coupled with the positioning pillars of the base, and the base and the positioning plate are overturned by 180 degrees, such that the chip is placed in the first chip accommodating portion. In step S3, the positioning plate is removed, and the second positioning holes of the screen plate are coupled with the positioning pillars of the base. In step S4, the solder paste is applied on the mesh region of the screen plate. In step S5, the screen plate is removed, and the connecting pads of the chip are covered with the solder paste. In step S6, the first positioning holes of the positioning plate are coupled with the positioning pillars of the base, and the base and the positioning plate are overturned by 180 degrees. In step S7, the second end portion of the pushing element is pressed, the chip is pushed by the first end portion of the pushing element and disengages from the first chip accommodating portion of the base, such that the chip is located in the second chip accommodating portion of the positioning plate.

Compared with a conventional solder paste mounting tool, the screen plate includes the flexible elements and the second position holes corresponding to the positioning pillars. Therefore, the user's fingers do not need to touch the solder paste, and the connecting pads having the solder paste can be separated from the screen plate in the perpendicular direction, such that the thickness of the solder paste covering the connecting pads is uniform. In addition, operation errors will not happen to different users easily, such that the qualities of the solder paste covering the connecting pads can be controlled easily. Furthermore, the chip adhered with the solder paste is pushed by the pushing element to be separated from the first chip accommodating portion of the base, such that the chip is located in the second chip accommodating portion of the positioning plate. As a result, the chip located in the second chip accommodating portion of the positioning plate may be preformed with subsequent processes (such as laser alignment), and thus it is time-saving. Moreover, the cushion pad is located in the opening of the through hole adjacent to the first surface or located on the first end portion. When the pushing element is moved to the opening of the first surface, the cushion pad may protect the chip from being damaged.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A solder paste mounting tool comprising:
   a base comprising a first surface, a second surface, a through hole, a first chip accommodating portion, and a plurality of positioning pillars, wherein the second surface and the first surface are located in the opposite face of the base, and the through hole passes through the first surface and the second surface, and the first chip accommodating portion and the positioning pillars are located on the first surface, and the position of the first chip accommodating portion is corresponding to the through hole;
   a positioning plate comprising a second chip accommodating portion and a plurality of first positioning holes corresponding to the positioning pillars, wherein when the first positioning holes are coupled with the positioning pillars, the second chip accommodating portion is aligned with the first chip accommodating portion;
   a screen plate comprising a mesh region and a plurality of second positioning holes corresponding to the positioning pillars, wherein when the second positioning holes are coupled with the positioning pillars and a chip is placed in the first chip accommodating portion, the mesh region is aligned with the first chip accommodating portion, and a plurality of connecting pads of the chip are applied with solder paste through the mesh region; and
   a pushing element movably disposed in the through hole, wherein the pushing element comprises a first end portion adjacent to the first surface and a second end portion adjacent to the second surface, when the second end portion is pressed, the chip is pushed by the first end portion and disengages from the first chip accommodating portion.

2. The solder paste mounting tool as claimed in claim 1, further comprising:
   a cushion pad which is disposed in an opening of the through hole adjacent to the first surface or is disposed on the first end portion.

3. The solder paste mounting tool as claimed in claim 2, wherein the material forming the cushion pad comprises rubber or plastic.

4. The solder paste mounting tool as claimed in claim 1, wherein a plurality of holes of the mesh region are corresponding to the connecting pads of the chip.

5. The solder paste mounting tool as claimed in claim 1, wherein a depth of the second chip accommodating portion is greater than a thickness of the chip.

6. The solder paste mounting tool as claimed in claim 1, wherein the positioning plate further comprises:
   a supporting portion formed in the second chip accommodating portion for supporting edges of the chip.

7. The solder paste mounting tool as claimed in claim 6, wherein a width of the supporting portion is substantially greater than or equal to 1 mm.

8. The solder paste mounting tool as claimed in claim 1, wherein the base further comprises:
   a plurality of flexible elements disposed on the first surface for separating the positioning plate or the screen plate from the first surface in a perpendicular direction.

9. The solder paste mounting tool as claimed in claim 8, wherein each of the flexible elements comprises a spring.

10. The solder paste mounting tool as claimed in claim 1, wherein the material forming the base or the screen plate comprises steel.

* * * * *